(12) United States Patent
Lin

(10) Patent No.: US 10,439,490 B2
(45) Date of Patent: Oct. 8, 2019

(54) RECTIFIER AND ASSOCIATED RECTIFYING CIRCUIT

(71) Applicant: FSP TECHNOLOGY INC., Taoyuan (TW)

(72) Inventor: Kuo-Fan Lin, Taoyuan (TW)

(73) Assignee: FSP TECHNOLOGY INC., Taoyuan (TW)

( * ) Notice: Subject to any disclaimer, the term of this patent is extended or adjusted under 35 U.S.C. 154(b) by 0 days.

(21) Appl. No.: 16/005,707

(22) Filed: Jun. 12, 2018

(65) Prior Publication Data

US 2018/0375427 A1     Dec. 27, 2018

Related U.S. Application Data

(60) Provisional application No. 62/525,222, filed on Jun. 27, 2017.

(51) Int. Cl.
| | | |
|---|---|---|
| *H02M 1/42* | (2007.01) | |
| *H02M 7/219* | (2006.01) | |
| *H02M 7/5387* | (2007.01) | |
| *H02M 3/158* | (2006.01) | |
| *H03K 17/06* | (2006.01) | |

(Continued)

(52) U.S. Cl.
CPC ....... *H02M 1/4233* (2013.01); *H02M 3/1588* (2013.01); *H02M 7/219* (2013.01); *H02M 7/5387* (2013.01); *H03K 17/063* (2013.01); *H03K 17/08122* (2013.01); *H02M 2007/2195* (2013.01); *H03K 2017/307* (2013.01)

(58) Field of Classification Search
CPC .. H02M 1/4233; H02M 3/1588; H02M 7/219; H02M 7/5387; H03K 17/063; H03K 17/08122
See application file for complete search history.

(56) References Cited

U.S. PATENT DOCUMENTS

2002/0074976 A1*   6/2002   Kunii ................. H02M 3/1563
                                                                             323/225
2009/0262560 A1* 10/2009   Hua .................. H02M 3/33592
                                                                      363/21.06

(Continued)

FOREIGN PATENT DOCUMENTS

CN           203466743 U     3/2014

*Primary Examiner* — Jeffrey A Gblende
*Assistant Examiner* — Bart Iliya
(74) *Attorney, Agent, or Firm* — Winston Hsu

(57) ABSTRACT

A rectifier, including: a first and a second input terminal, a first output terminal and at least one rectifying circuit. Each rectifying circuit including: a switching circuit including a transistor, and a driving circuit. The driving circuit is coupled to the switching circuit and controls a switching status of the switching circuit, and includes a totem-pole circuit and an input transistor. The totem-pole circuit includes an input terminal and an output terminal coupled to the transistor. The input transistor is coupled between the totem-pole circuit and the switching circuit. The at least one rectifying circuit includes a first and a second rectifying circuit. The transistors of the first rectifying circuit and the second rectifying circuit are coupled to the first output terminal. The input transistors of the first rectifying circuit and the second rectifying circuit are coupled to the first input terminal and the second input terminal, respectively.

19 Claims, 3 Drawing Sheets

(51) Int. Cl.
*H03K 17/0812* (2006.01)
*H03K 17/30* (2006.01)

(56) References Cited

U.S. PATENT DOCUMENTS

| | | | | |
|---|---|---|---|---|
| 2009/0284303 | A1* | 11/2009 | Hu | H03K 17/145 327/434 |
| 2010/0046259 | A1* | 2/2010 | Ho | H02M 7/217 363/126 |
| 2010/0309701 | A1* | 12/2010 | Wu | H02M 3/33592 363/127 |
| 2017/0179846 | A1* | 6/2017 | Hui | H02M 7/219 |

* cited by examiner

RECTIFIER AND ASSOCIATED RECTIFYING CIRCUIT

CROSS REFERENCE TO RELATED APPLICATIONS

This application claims the benefit of U.S. provisional application No. 62/525,222 filed on Jun. 27, 2017 and incorporated herein by reference.

BACKGROUND OF THE INVENTION

1. Field of the Invention

The present invention relates to a rectifier and an associated rectifying circuit.

2. Description of the Prior Art

A traditional bridge rectifier is typically implemented by four diodes. Refer to FIG. 1, FIG. 1 is a diagram illustrating a bridge rectifier 1 implemented by diodes in the prior art. The bridge rectifier 1 comprises diodes D1-D4, input terminals IN1 and IN2, and output terminals OUT1 and OUT2. The traditional bridge rectifier typically has advantages suchlike the size of a transformer thereof is relatively small. However, regarding a bridge rectifier implemented by diodes, the peak inverse voltage of the diodes is required to reach a certain voltage level. Once the diodes corresponding to such high performance are utilized, the manufacturing cost is accordingly increased. Therefore, a novel rectifier architecture is desired to solve the aforementioned problem.

SUMMARY OF THE INVENTION

One of objectives of the present invention is to provide a rectifier and an associated rectifying circuit to solve the aforementioned problem.

According to an embodiment of the present invention, a rectifier is disclosed, comprising: a first input terminal, a second input terminal, a first output terminal and at least one rectifying circuit. Each of the at least one rectifying circuit comprises: a switching circuit and a driving circuit. The switching circuit comprises a transistor; the driving circuit is coupled to the switching circuit and configured to control a switching status of the switching circuit, and the driving circuit comprises a totem-pole circuit and an input transistor. The totem-pole circuit comprises an input terminal and an output terminal, and the output terminal is coupled to the transistor. The input transistor is coupled between the totem-pole circuit and the switching circuit. The at least one rectifying circuit comprises a first rectifying circuit and a second rectifying circuit, the transistors of the first rectifying circuit and the second rectifying circuit are coupled to the first output terminal, and the input transistors of the first rectifying circuit and the second rectifying circuit are coupled to the first input terminal and the second input terminal, respectively.

According to an embodiment of the present invention, a rectifying circuit is disclosed, comprising: a switching circuit and a driving circuit. The switching circuit comprises a transistor. The driving circuit is coupled to the switching circuit and configured to control a switching status of the switching circuit, and the driving circuit comprises a totem-pole circuit and an input transistor. The totem-pole circuit comprises an input terminal and an output terminal, and the output terminal is coupled to the transistor. The input transistor is coupled between the totem-pole circuit and the switching circuit.

These and other objectives of the present invention will no doubt become obvious to those of ordinary skill in the art after reading the following detailed description of the preferred embodiment that is illustrated in the various figures and drawings.

DETAILED DESCRIPTION

Certain terms are used throughout the description and following claims to refer to particular components. As one skilled in the art will appreciate, manufacturers may refer to a component by different names. This document does not intend to distinguish between components that differ in name but not function. In the following description and in the claims, the terms "include" and "comprise" are used in an open-ended fashion, and thus should not be interpreted as a close-ended term such as "consist of". Also, the term "couple" is intended to mean either an indirect or direct electrical connection. Accordingly, if one device is coupled to another device, that connection may be through a direct electrical connection, or through an indirect electrical connection via other devices and connections.

Figure 1:
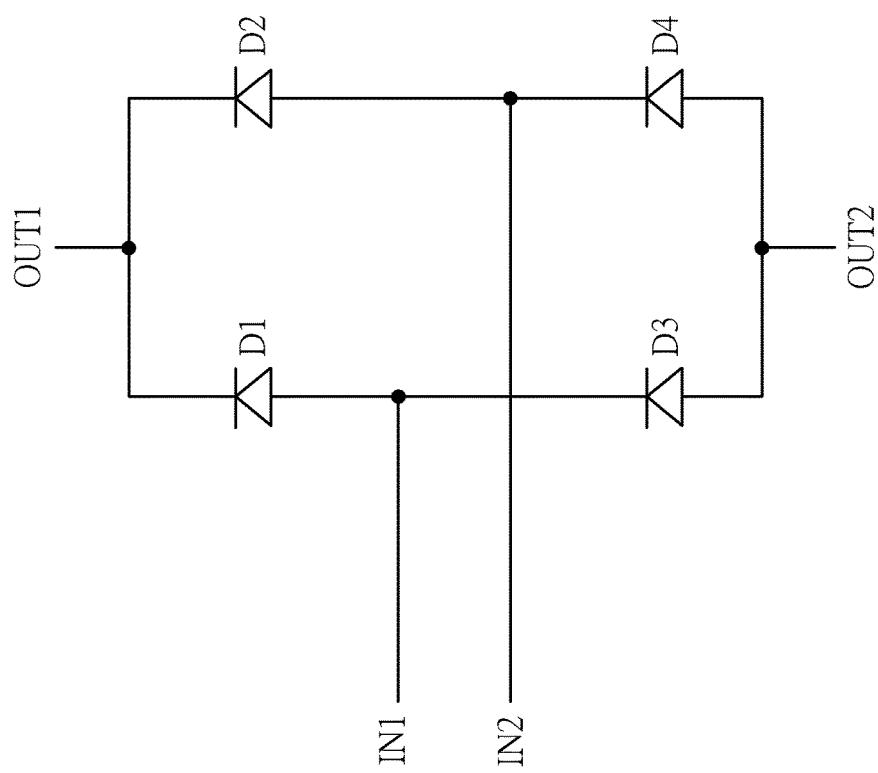
FIG. 1 is a diagram illustrating a full-wave rectifier in the prior art.
Figure 2:
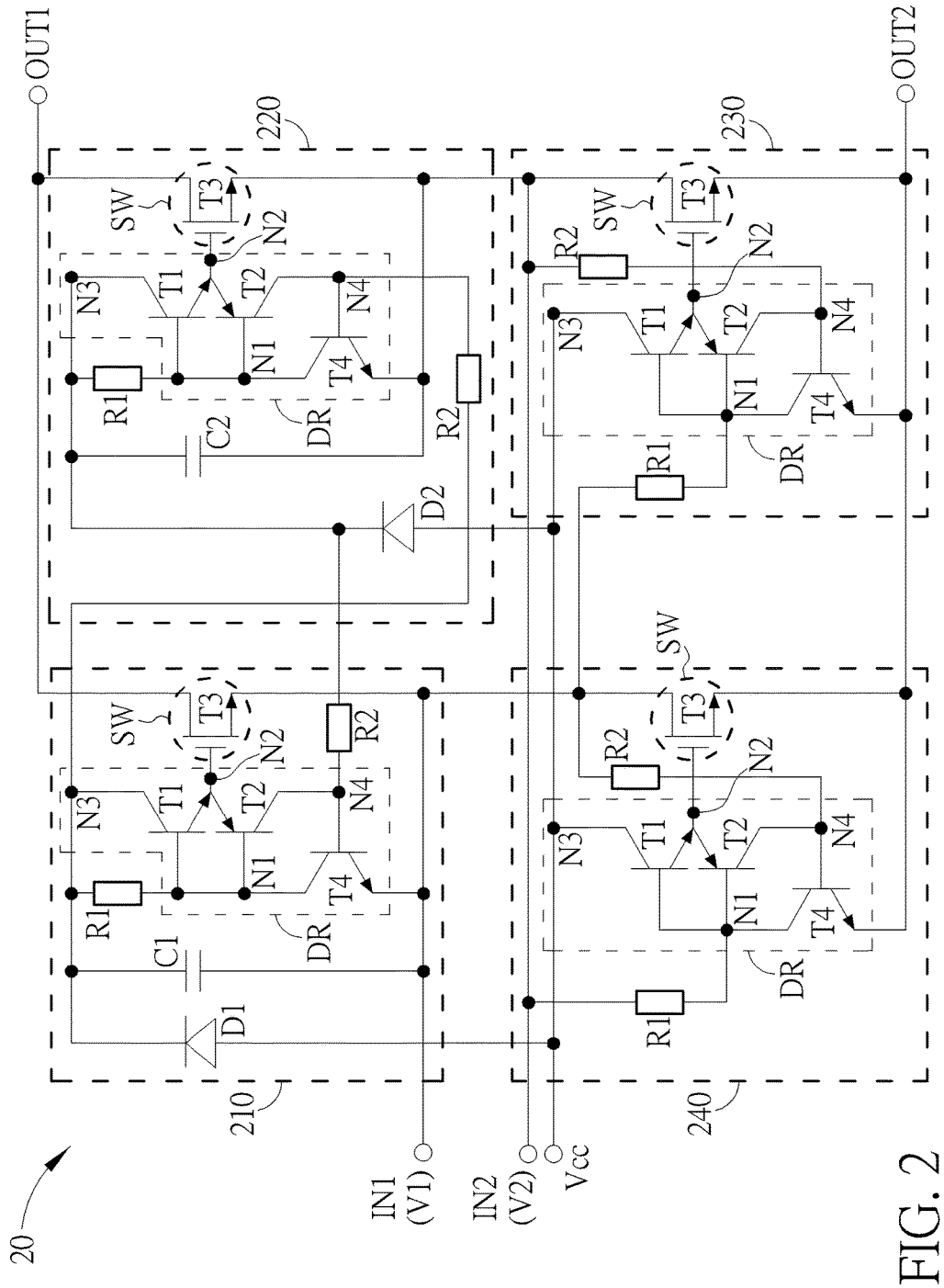
FIG. 2 is a diagram illustrating a full-wave rectifier according to an embodiment of the present invention.

FIG. 2 is a diagram illustrating a bridge rectifier 20 according to an embodiment of the present invention. As shown in FIG. 2, the bridge rectifier 20 comprises rectifying circuits 210, 220, 230, and 240, input terminals IN1 and IN2, output terminals OUT1 and OUT2, wherein the input terminal IN1 is a natural wire terminal while the input terminal IN2 is a fire wire terminal. The input terminal IN1 and IN2 are coupled to an electromagnetic interference filter circuit (not shown in FIG. 2). Refer to FIG. 2 in conjunction with FIG. 1, the rectifying circuits 210-240 proposed by the present invention can be interpreted as the diodes D1-D4 shown in FIG. 1, and the rectifying circuits 210-240 are basically identical. Each of the rectifying circuits 210-240 comprises a switching circuit SW and a driving circuit DR, wherein the switching circuit SW is implemented by an N-type Metal Oxide Semiconductor Field Effect Transistor (MOSFET) T3 (hereinafter the transistor T3), and the driving circuit DR comprises a totem-pole circuit composed by Bipolar Junction Transistors (BJTs) and an input transistor T4 composed by an N-type MOSFET. The totem-pole circuit of the driving circuit DR is composed by an npn BJT T1 (hereinafter the transistor T1) and a pnp BJT (hereinafter the transistor T2), and the totem-pole circuit further comprises an input terminal N1, an output terminal N2 and terminals N3 and N4. The input terminal N1 is coupled to base terminals of the transistors T1 and T2 while the output terminal N2 is coupled to emitter terminals of the transistors T1 and T2 and a gate terminal of the transistor T3. The terminal N3 is coupled to a collector terminal of the transistor T1 while the terminal N4 is coupled to a collector terminal of the transistor T2. In addition, as shown in FIG. 2, the input transistor T4 of the driving circuit DR is coupled between the totem-pole circuit and the switching circuit SW. More specifically, a base terminal of the transistor T4 is coupled to the terminal N4, a collector terminal of the transistor T4 is coupled to the terminal N1, and a emitter terminal of the transistor T4 is coupled to a source terminal of the transistor T3. In addition, drain terminals of the transistors T3 of the rectifying circuits 210 and 220 are coupled to the output terminal OUT1 and source terminals of the transistor T3 of the rectifying circuit 230 and 240 are coupled to the output terminal OUT2.

Refer to FIG. 2 again, each of the rectifying circuit 210 and 220 comprises a bootstrap circuit, and the bootstrap circuit and a reference voltage Vcc are utilized to elevate the voltage level on the terminal N3 to provide power to the totem-pole circuit and the input transistor T4. In this embodiment, the maximum of the reference voltage Vcc is 12 volts. The bootstrap circuit of the rectifying circuit 210 is composed by a diode D1 and a capacitor C1. More specifically, an anode of the diode D1 is coupled to a reference voltage Vcc while a cathode of the diode D1 is coupled to the terminal N3, and a terminal of the capacitor C1 is coupled to the terminal N3 while the other terminal of the capacitor C1 is coupled to a source terminal of the transistor T4 and input terminal IN1. In addition, the bootstrap circuit of the rectifying circuit 220 is composed by a diode D2 and a capacitor C2. More specifically, an anode of the diode D2 is coupled to the reference voltage Vcc while a cathode of the diode D2 is coupled to the terminal N3, and a terminal of the capacitor C2 is coupled to the terminal N3 while the other terminal of the capacitor C2 is coupled to the source terminal of the transistor T4 and input terminal IN2.

Each of the rectifying circuits 210-240 comprises resistors R1 and R2. Regarding the rectifying circuit 210, a terminal of the resistor R1 is coupled to the terminal N1 while the other terminal of the resistor R1 is coupled to the terminal N3, and a terminal of the resistor R2 is coupled to the terminal N4 while the other terminal of the resistor R2 is coupled to the terminal N3 of the rectifying circuit 220; Regarding the rectifying circuit 220, a terminal of the resistor R1 is coupled to the terminal N1 while the other terminal of the resistor R1 is coupled to the terminal N3, and a terminal of the resistor R2 is coupled to the terminal N4 while the other terminal of the resistor R2 is coupled to the terminal N3 of the rectifying circuit 210; Regarding the rectifying circuit 230, a terminal of the resistor R1 is coupled to the terminal N1 while the other terminal of the resistor R1 is coupled to a drain terminal of the transistor T3 of the rectifying circuit 240, and a terminal of the resistor R2 is coupled to the terminal N4 while the other terminal of the resistor R2 is coupled to the input terminal IN2; Regarding the rectifying circuit 240, a terminal of the resistor R1 is coupled to the terminal N1 while the other terminal of the resistor R1 is coupled to the input terminal IN2, and a terminal of the resistor R2 is coupled to the terminal N4 while the other terminal of the resistor R2 is coupled to a drain terminal of the transistor T3 of the rectifying circuit 240.

The operation of the bridge rectifier 20 has three different statuses while will be described in the following paragraphs.

When an absolute value of a difference between the voltage (labeled as "V1" in FIG. 2) on the input terminal IN1 and the voltage (labeled as "V2" in FIG. 2) on the input terminal IN2 is smaller than the reference voltage Vcc, i.e. $|V1-V2|<Vcc$, the input transistor T4 is activated, to allow a strong current to flow through the transistor T4 via the totem-pole circuit. The voltage on the terminal N2 is accordingly decreased, and the transistor T3 is deactivated. Therefore, when an absolute value of a difference between the voltage (labeled as "V1" in FIG. 2) on the input terminal IN1 and the voltage (labeled as "V2" in FIG. 2) on the input terminal IN2 is smaller than the reference voltage Vcc, the rectifying circuits 210-240 are closed.

Figure 3:
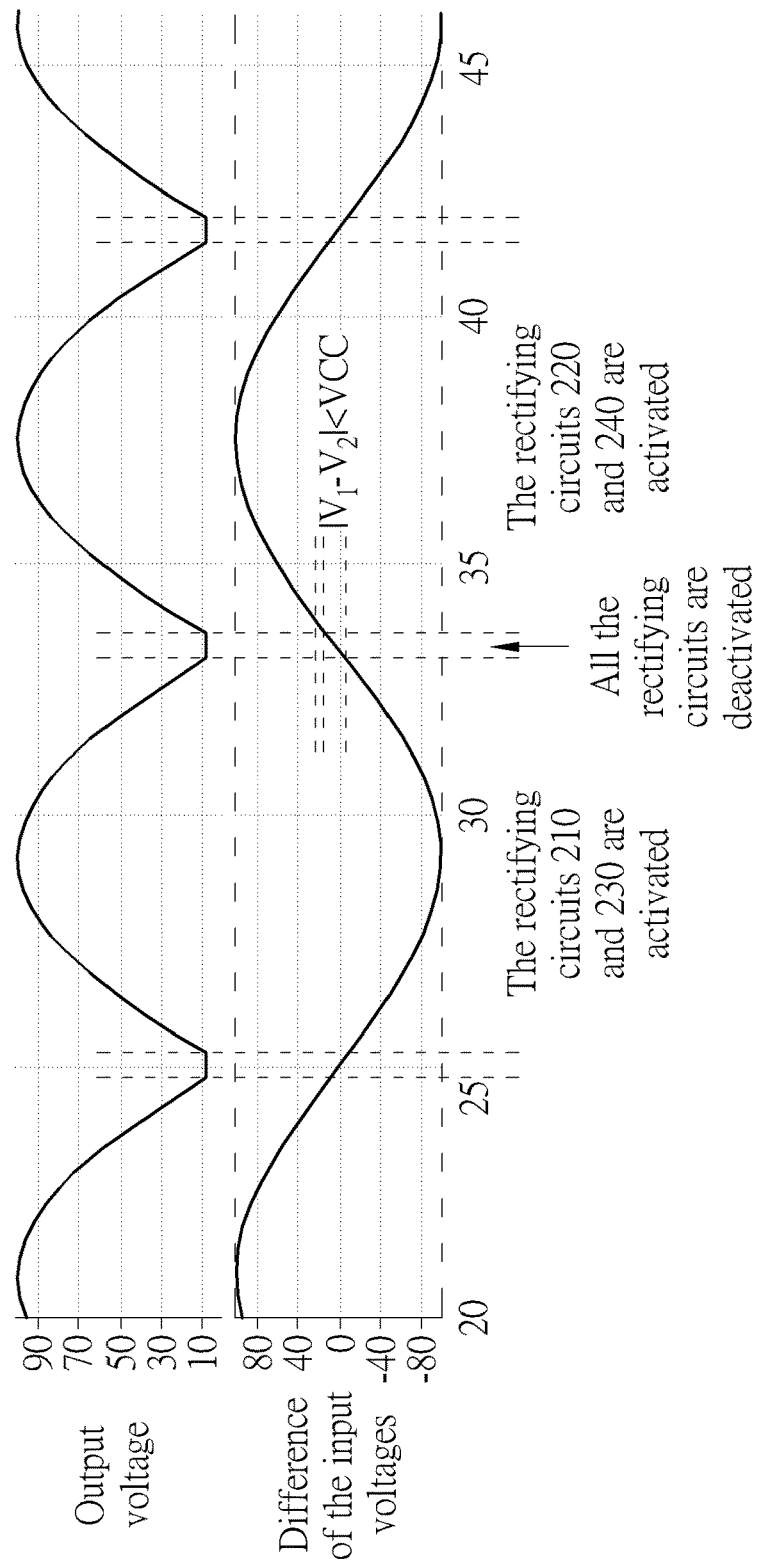
FIG. 3 is a diagram illustrating a difference value of the input voltage and the output voltage according to an embodiment of the present invention.

When an absolute value of a difference between the voltage (labeled as "V1" in FIG. 2) on the input terminal IN1 and the voltage (labeled as "V2" in FIG. 2) on the input terminal IN2 is greater than the reference voltage Vcc, i.e. $V1-V2>Vcc$, the difference of the input voltages is a negative half wave waveform (refer to the difference of the input voltage in FIG. 3). The input transistors T4 of the rectifying circuits 220 and 240 are accordingly activated to make the voltages on the terminals N2 of the rectifying circuits 220 and 240 decrease. The transistors T3 of the rectifying circuit 220 and 240 are deactivated. Oppositely, the transistors T4 of the rectifying circuits 210 and 230 are deactivated, and the current flows to the terminal N2 from the terminal N3 to make the transistors T3 of the rectifying circuits 210 and 230 activate by being driven by the totem-pole circuit. Therefore, when an absolute value of a difference between the voltage (labeled as "V1" in FIG. 2) on the input terminal IN1 and the voltage (labeled as "V2" in FIG. 2) on the input terminal IN2 is greater than the reference voltage Vcc, the rectifying circuit 210 and the rectifying circuit which is positioned on the diagonal corner of the rectifying circuit 210 (i.e. the rectifying circuit 230) are activated, and the rectifying circuit 220 and the rectifying circuit which is positioned on the diagonal corner of the rectifying circuit 220 (i.e. the rectifying circuit 240) are deactivated.

When an absolute value of a difference between the voltage (labeled as "V2" in FIG. 2) on the input terminal IN2 and the voltage (labeled as "V1" in FIG. 2) on the input terminal IN1 is greater than the reference voltage Vcc, i.e. $V2-V1>Vcc$, the difference of the input voltages is a positive half wave waveform. The input transistors T4 of the rectifying circuits 210 and 230 are activated to make the voltages on the terminals N2 of the rectifying circuits 210 and 230 decrease. The transistors T3 of the rectifying circuits 210 and 230 are deactivated. Oppositely, the transistors T4 of the rectifying circuits 220 and 240 are deactivated, and the current flows to the terminal N2 from the terminal N3 to make the transistors T3 of the rectifying circuit 220 and 240 activate by being driven by the totem-pole circuit. Therefore, when an absolute value of a difference between the voltage (labeled as "V2" in FIG. 2) on the input terminal IN2 and the voltage (labeled as "V1" in FIG. 2) on the input terminal IN1 is greater than the reference voltage Vcc, the rectifying circuit 220 and the rectifying circuit which is positioned on the diagonal corner of the rectifying circuit 220 (i.e. the rectifying circuit 240) are activated, and the rectifying circuit 210 and the rectifying circuit which is positioned on the diagonal corner of the rectifying circuit 210 (i.e. the rectifying circuit 230) are deactivated.

Normally, the difference of the voltage (labeled as "V1" in FIG. 2) on the input terminal IN1 and the voltage (labeled as "V2" in FIG. 2) on the input terminal IN2 forms a sin wave, and by the rectifying operation of the bridge rectifier 20, the voltage on the output terminal OUT1 or OUT2 shows a full wave rectifying waveform. However, by the architecture proposed by the present invention, when $|V1-V2|>Vcc$, the transistors T3 of the rectifying circuits 210-240 are temporarily deactivated to keep the output voltage above the 0 volt. Refer to FIG. 3 which is a diagram illustrating a difference value of the input voltage and the output voltage according to an embodiment of the present invention, such as the shown waveform of the difference of the input voltages (V1–V2), when the waveform of V1–V2 enters a range defined by +12 volts and −12 volts, the output voltage is kept at 10 volts approximately. When the waveform of V1–V2 keeps decreasing, the bridge rectifier 20 enters in to a state that the rectifying circuits 210 and 230 are activated while the rectifying circuits 220 and 240 are deactivated, and the waveform of the output voltage shows a full wave rectifying waveform. Oppositely, when the waveform of V1–V2 keeps increasing the bridge rectifier 20 enters in to a state that the rectifying circuits 220 and 240 are activated while the rectifying circuits 210 and 230 are deactivated, and the waveform of the output voltage also shows a full wave rectifying waveform.

It should be noted that, the bridge rectifier 20 proposed by the present invention can be an analogy of the traditional bridge rectifier implemented by diodes. The only difference is the diodes in the traditional bridge rectifier are replaced by transistors in the present invention, and BJTs are utilized to implement the driving circuit. However, those skilled in the art should readily understand that the full wave rectifier is not limited to be implemented by the bridge rectifier comprising 4 diodes. A full wave rectifier can also be implemented by 2 diodes. Therefore, by implementing a rectifier with two rectifying circuits (e.g. the rectifying circuit 210 and 230) proposed by the present invention, the same rectifying effect can also be achieved. In other words, the present invention is not limited by to be implemented by 4 rectifying circuits, i.e. the rectifying circuits 210-240.

Briefly summarized, by the architecture of the present invention, when the input terminals are suddenly short circuited, the output voltage can still be kept at a voltage value to prevent the circuits from being damaged due to the huge swing of the voltage. In addition, the present invention utilizes BJT to implement the driving circuit which lowers the manufacturing cost comparing to the art implementing the driving circuit by driver ICs.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A rectifier, comprising:
   a first input terminal, a second input terminal, and a first output terminal; and
   at least one rectifying circuit, wherein each of the at least one rectifying circuit comprises:
      a switching circuit, wherein the switching circuit comprises a transistor; and
      a driving circuit, coupled to the switching circuit, wherein the driving circuit is arranged to control a switching status of the switching circuit, the driving circuit comprising:
         a totem-pole circuit, comprising an input terminal and an output terminal, wherein the output terminal is coupled to the transistor; and
         an input transistor, coupled between the totem-pole circuit and the switching circuit;
   wherein the at least one rectifying circuit comprises a first rectifying circuit and a second rectifying circuit, the transistors of the first rectifying circuit and the second rectifying circuit are coupled to the first output terminal, and the input transistors of the first rectifying circuit and the second rectifying circuit are coupled to the first input terminal and the second input terminal, respectively.

2. The rectifier of claim 1, wherein each of the first rectifying circuit and the second rectifying circuit comprises a bootstrap circuit, the bootstrap circuit comprises:
   a diode, wherein an anode of the diode is coupled to a reference voltage, and a cathode of the diode is coupled to the totem-pole circuit; and
   a capacitor, wherein a terminal of the capacitor is coupled to the cathode of the diode, and the other terminal of the capacitor is coupled to one of the first input terminal and the second input terminal.

3. The rectifier of claim 1, wherein the first rectifying circuit comprises a resistor, a terminal of the resistor is coupled to the input terminal of the totem-pole circuit of the first rectifying circuit, and the other terminal of the resistor is coupled to a transistor of the totem-pole circuit of the first rectifying circuit.

4. The rectifier of claim 1, wherein the first rectifying circuit comprises a resistor, a terminal of the resistor is coupled to the input transistor of the first rectifying circuit, and the other terminal of the resistor is coupled to a reference voltage.

5. The rectifier of claim 1, wherein at least one rectifying circuit further comprises a third rectifying circuit and a fourth rectifying circuit, the transistors of the third rectifying circuit and the fourth rectifying circuit are coupled to one of the first input terminal and the second input terminal, respectively, and the input transistors of the third rectifying circuit and the fourth rectifying circuit are coupled to a second output terminal of the rectifier.

6. The rectifier of claim 5, wherein the totem-pole circuits of the third rectifying circuit and the fourth rectifying circuit are coupled to a reference voltage.

7. The rectifier of claim 5, wherein the third rectifying circuit comprises a resistor, a terminal of the resistor is coupled to the input transistor, and the other terminal of the resistor is coupled to the transistor.

8. The rectifier of claim 5, wherein the third rectifying circuit comprises a resistor, a terminal of the resistor is coupled to the input terminal of the totem-pole circuit, and the other terminal of the resistor is coupled to one of the first input terminal and the second input terminal.

9. The rectifier of claim 5, wherein when an absolute value of a voltage difference between the first input terminal and the second input terminal is smaller than a reference voltage, the switching status of the switching circuit of each of the at least one rectifying circuit are deactivated.

10. The rectifier of claim 5, wherein when a voltage on the first input terminal is one reference voltage greater than a voltage on the second input terminal, the switching circuit of one of the first rectifying circuit and the second rectifying circuit is activated, the switching circuit of the other of the first rectifying circuit and the second rectifying circuit is deactivated, the switching circuit of one of the third rectifying circuit and the fourth rectifying circuit is activated, and the switching circuit of the other of the third rectifying circuit and the fourth rectifying circuit is deactivated.

11. The rectifier of claim 5, wherein the transistor of the switching circuit of the at least one rectifying circuit is an N-type Metal Oxide Semiconductor Field Effect Transistor (MOSFET), a drain terminal of the transistor of each of the first rectifying circuit and the second rectifying circuit is coupled to the first output terminal, a source terminal of the transistor of each of the first rectifying circuit and the second rectifying circuit is coupled to one of the first input terminal and the second input terminal, a drain terminal of the transistor of each of the third rectifying circuit and the fourth rectifying circuit is coupled to one of the first input terminal and the second input terminal, a source terminal of the transistor of each of the third rectifying circuit and the fourth rectifying circuit is coupled to the second output terminal.

12. The rectifier of claim 1, wherein the totem-pole circuit comprises an npn Bipolar Junction Transistor (BJT), and a pnp BJT, a emitter terminal of the npn BJT and an emitter terminal of the pnp BJT are coupled to the output terminal of the totem-pole circuit, and a base terminal of the npn BJT and a base terminal of the pnp BJT are coupled to the input terminal of the totem-pole circuit.

13. The rectifier of claim 12, wherein the input transistor is an npn BJT, and a base terminal of the input transistor is coupled to a collector terminal of the pnp BJT of the totem-pole circuit, a collector terminal of the input transistor is coupled to the input terminal of the totem-pole circuit, and an emitter terminal of the input transistor is coupled to one of the first input terminal and the second input terminal.

14. A rectifying circuit, comprising:
a switching circuit, wherein the switching circuit comprises a transistor; and
a driving circuit, coupled to the switching circuit, wherein the driving circuit is arranged to control a switching status of the switching circuit, the driving circuit comprising:
a totem-pole circuit, wherein the totem-pole circuit comprises an input terminal and an output terminal, and the output terminal is coupled to the transistor; and
an input transistor, coupled between the totem-pole circuit and the switching circuit, wherein the input transistor is an npn Bipolar Junction Transistor (BJT), an emitter terminal of the input transistor is coupled to an input terminal of the rectifying circuit, a base terminal of the input transistor is coupled to a collector terminal of a pnp BJT of the totem-pole circuit, and a collector terminal of the input transistor is coupled to the input terminal of the totem-pole circuit.

15. The rectifying circuit of claim 14, further comprising:
a bootstrap circuit, comprising:
a diode, wherein an anode of the diode is coupled to a reference voltage, and a cathode of the diode is coupled to the totem-pole circuit; and
a capacitor, wherein a terminal of the capacitor is coupled to the cathode of the diode, and the other terminal of the capacitor is coupled to the input terminal of the rectifying circuit.

16. The rectifying circuit of claim 14, wherein the transistor of the switching circuit is an N-type Metal Oxide Semiconductor Field Effect Transistor (MOSFET), a drain terminal of the transistor is coupled to an output terminal of the rectifying circuit, and a source terminal of the transistor is coupled to the input terminal of the rectifying circuit.

17. The rectifying circuit of claim 14, wherein the totem-pole circuit comprises an npn BJT and the pnp BJT, an emitter terminal of the npn BJT and an emitter terminal of the pnp BJT are coupled to the output terminal of the totem-pole circuit, and a base terminal of the npn BJT and a base terminal of the pnp BJT are coupled to the input terminal of the totem-pole circuit.

18. The rectifying circuit of claim 14, further comprising:
a resistor, wherein a terminal of the resistor is coupled to the input terminal of the totem-pole circuit, and the other terminal of the resistor is coupled to a transistor of the totem-pole circuit.

19. The rectifying circuit of claim 14, further comprising:
a resistor, wherein a terminal of the resistor is coupled to the input transistor, and the other terminal of the resistor is coupled to a reference voltage.

* * * * *